United States Patent
Foss

[11] Patent Number: 5,870,329
[45] Date of Patent: Feb. 9, 1999

[54] ENHANCED ASIC PROCESS CELL

[75] Inventor: Richard C. Foss, Kirkcaldy Fife, Scotland

[73] Assignee: Mosaid Technologies Incorporated, Kanata, Canada

[21] Appl. No.: 833,741

[22] Filed: Apr. 7, 1997

[30] Foreign Application Priority Data

Feb. 28, 1997 [CA] Canada ................................. 2198839

[51] Int. Cl.⁶ .................................................. G11C 11/24
[52] U.S. Cl. ............................ 365/149; 365/150; 257/908
[58] Field of Search .................................. 365/149, 150; 257/296, 300, 906, 908

[56] References Cited

U.S. PATENT DOCUMENTS

| | | | |
|---|---|---|---|
| 4,914,627 | 4/1990 | Eaton, Jr. et al. | 365/149 |
| 5,148,393 | 9/1992 | Furuyama | 365/149 |
| 5,629,888 | 5/1997 | Saito et al. | 365/149 |

*Primary Examiner*—Tan T. Nguyen
*Attorney, Agent, or Firm*—E. E. Pascal

[57] ABSTRACT

A DRAM bit storage cell comprising a pair of capacitors each having one plate connected to a source or drain of a pass FET, another plate of a first of the pair of capacitors connected to a first voltage rail or a source of voltage boosted from the voltage of the first voltage rail, and another plate of a second of the pair of capacitors connected to a voltage rail opposite in polarity to the first voltage rail.

15 Claims, 2 Drawing Sheets

ENHANCED ASIC PROCESS CELL

FIELD OF THE INVENTION

This invention relates to the field of integrated circuit memories, and in particular to a dynamic random access memory (DRAM) bit storage cell.

BACKGROUND TO THE INVENTION

Binary bits stored in a standard DRAM are represented by the voltage values of charge stored in capacitors. The capacitors are typically formed of insulated gate field effect transistors (FETs). Charge is written to a capacitor by applying a voltage from a bit line through the source-drain circuit of a pass field effect transistor, which is enabled by applying an address signal from a word line to the gate of the pass transistor.

To speed up reading from or writing charge to the capacitor, the bit line and the capacitor are typically first precharged to a value of half of a power rail voltage, e.g. Vdd/2. When the actual value of a 0 or 1 bit is to be stored, e.g. nominally to Vss or Vdd, the time for the full charge to be passed to or removed from the capacitor to achieve the nominal Vss or Vdd voltage is thereby reduced since the capacitor will already have about half the voltage required to achieve the ultimate bit value.

A structure which illustrates the above in a standard DRAM is shown in FIG. 1A, and a graph illustrating voltage with at two different supply voltages is shown in FIG. 1B.

A pass FET 1 is shown having its source-drain circuit connected between a plate of charge storage capacitor 3 and a bit line BL. The gate of FET 1 is connected to a word line WL. The bit line is connected through a precharge enable FET 5 to a source of bit line precharge voltage Vblp=Vdd/2. A precharge enable logic signal is applied to the gate of FET 5, to cause the bit line to be precharged to Vdd/2.

A source of cell plate precharge voltage Vcp=Vdd/2 is applied to the other plate of the capacitor 3. Operation of the above-described circuit to write and read charge (bits) on capacitor 3 is well known to those skilled in the art and need not be described further herein.

With reference to FIG. 1B, the precharge voltages are shown as the voltage represented by the middle horizontal line, values Vcp and Vblp which have the voltage value Vdd/2. The voltage values Vdd and Vss relative to Vdd/2 are also shown. The value of a bit "0" is the lower dashed line, approximately Vss (ground) separated from the value Vdd/2 by the value "x". The value of a bit "1" is the higher dashed line, which is approximately Vdd, separated from the value Vdd/2 by the value "x". The two values "x" are substantially the same.

When using conventional Vdd/2 precharge for the bit lines, a proportion (approximately half) of any change in Vdd between write and read operations detracts from the signal margin, as can be shown in what is generally known as a "bump test", wherein the supply voltage is changed.

If the supply voltage changes (e.g. is "bumped") between the time a cell is written and the time a cell is read, both of the values "x" remain the same as before, since both Vcp and Vblp remain equal to Vdd/2, as shown at the right hand portion of FIG. 1B.

However, in an application specific integrated circuit (ASIC) DRAM cell such as one described in U.S. patent application Ser. No. 08/355,956 filed Dec. 14, 1994, invented by K. Skjaveland and P. Gillingham, the cell capacitor plate must be held at a voltage other than Vdd/2, such as at Vdd or Vpp (where Vpp=Vdd+Vtn), in order to turn on the channel of the p-channel FET of which the capacitor is formed.

Problems with the ASIC form of DRAM cell result from the p-doped substrate having Vss connected to it, rather than a back bias voltage as is used in standard memory processes. Since there is no back bias voltage on the memory cell access FET, subthreshold leakage from the capacitor is undesirably high.

The ASIC process does not allow the use of the pluralized standard DRAM cell techniques such as trench cells, etc. Further, as noted above, no back bias (VBB) negative voltage is permitted in ASIC process.

In the aforementioned patent application the source/drain of the capacitor FET serves as a capacitor cell plate and must be biased to either a positive supply rail (in the case of PMOS cell implementation) or to ground (in the case of an NMOS cell implementation.)

FIG. 2A illustrates the prior art structure, which is similar to FIG. 1A except that the capacitor is formed of an FET and the precharge voltage Vcp =Vpp=(Vdd+Vtn). In this case the voltages are as illustrated in FIG. 2B. Alternately, the cell plate may be connected directly to Vdd.

Prior to the voltage "bump", the difference in voltage between Vss and Vblp is "x", (Vdd/2 ), and the difference in voltage between Vdd and Vblp is also the same value "x", (Vdd/2). Both voltage differences "x" are substantially the same.

However, after the voltage "bump", the value of a "0" is the difference between the raised voltage from Vss and Vblp, which is shown as "z", while the value of a "1" is the difference between Vblp and the raised value of approximately Vdd. Clearly the values of "y" and "z" after the "bump" are not the same as the signals "x", and the value "z" is smaller than the value "y". Thus the "0" voltage margin has been lost. If the bump was negative, the "1" voltage margin would be lost. This effectively introduces noise, making the values of "0" and "1" less reliable than in the case of the circuit of FIG. 1A.

SUMMARY OF THE INVENTION

In accordance with the present invention, a capacitor, preferably equal in value to the charge storage capacitor, is connected between the junction of the charge storage capacitor and the pass FET, and a voltage having opposite polarity to the voltage applied to the charge storage capacitor. If the capacitors are equal in value, this will form the equivalent of voltage on a charge storage cell plate at its junction of the pass FET of Vdd/2. The voltage margins "x" for a "0" and a "1", before and after the voltage "bump", are thereby maintained, eliminating the noise problem incurred in the prior art circuit.

In accordance with an embodiment of the invention, a DRAM bit storage cell comprises a pair of capacitors each having one plate connected to a source or drain of a pass FET, another plate of a first of the pair of capacitors connected to a first voltage rail or a source of voltage boosted from the voltage of the first voltage rail, and another plate of a second of the pair of capacitors connected to a voltage rail opposite in polarity to the first voltage rail (or ground).

In accordance with another embodiment, a DRAM bit storage circuit comprises a bit line for selectively receiving a bit line precharge voltage and a word line for selectively receiving a first voltage from a first voltage source, a cell access FET having a gate connected to the word line, a source or drain connected to the bit line, and another of the source or drain connected to a first plate of a first capacitor, a second plate of the first capacitor connected to a second voltage source having similar polarity as the first voltage source, and a second capacitor connected between the first plate of the first capacitor and a third voltage source having polarity opposite to the first voltage source (or ground).

BRIEF INTRODUCTION TO THE DRAWINGS

A better understanding of the invention will be obtained by considering the detailed description below, with reference to the following drawings, in which:

FIG. 1A is a schematic diagram of a DRAM cell in accordance with the prior art,

FIG. 1B is a graph of voltage prior to and following a power supply voltage "bump", in the case of the cell of FIG. 1A, FIG. 2A is a schematic diagram of a DRAM cell in accordance with other prior art, FIG. 2B is a graph of voltage prior to and following a power supply voltage "bump" in the case of the cell of FIG. 2A, FIG. 3 is a schematic diagram of a DRAM cell in accordance with an embodiment of the present invention, and FIGS. 4 and 5 are cross-sections of a memory cell in an integrated circuit in accordance with an embodiment of the present invention.

DETAILED DESCRIPTION OF EMBODIMENTS OF THE PRESENT INVENTION

Figure 2A:
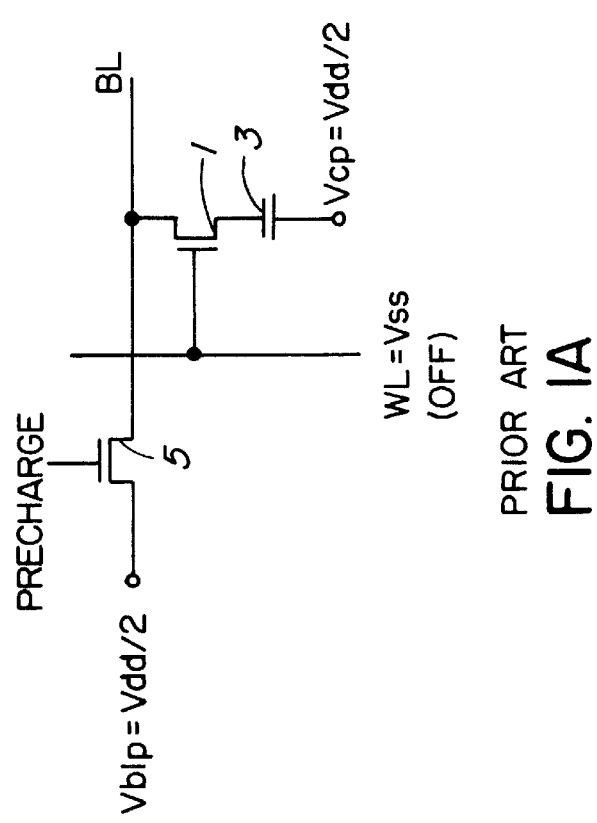
Figure 2B:
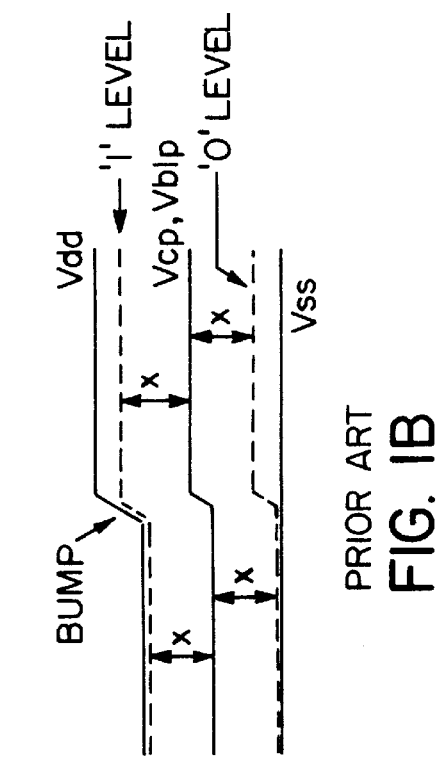
Figure 3:
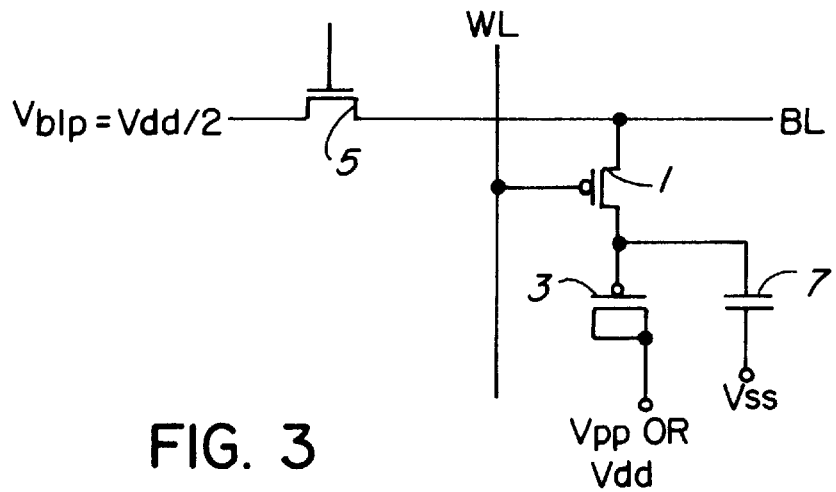

In the memory cell illustrated in FIG. 3, the capacitor is formed of elements of an FET, similar to the capacitor of FIG. 2A. As in FIG. 2A, the voltage applied to the capacitor is Vdd or Vpp (Vdd+Vtn). However, in this case, an additional capacitor 7 is connected with one ate connected to the junction of the (gate) plate of capacitor 2 with FET 1, and with another plate connected to a voltage Vss (ground), which is opposite in polarity to the voltage Vdd or Vpp. The term opposite polarity is used in this specification to denote either ground or a voltage spaced from ground of opposite polarity to Vdd or Vpp.

Figure 1A:
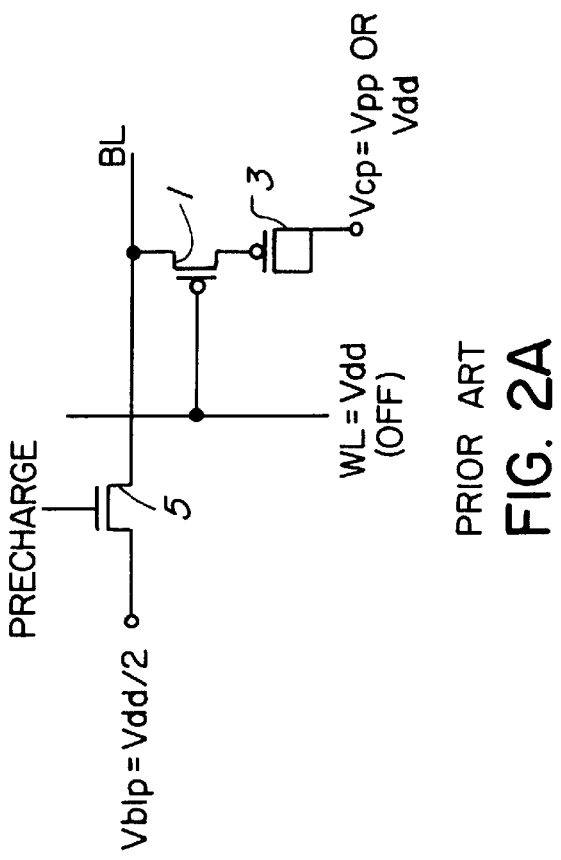
Figure 1B:
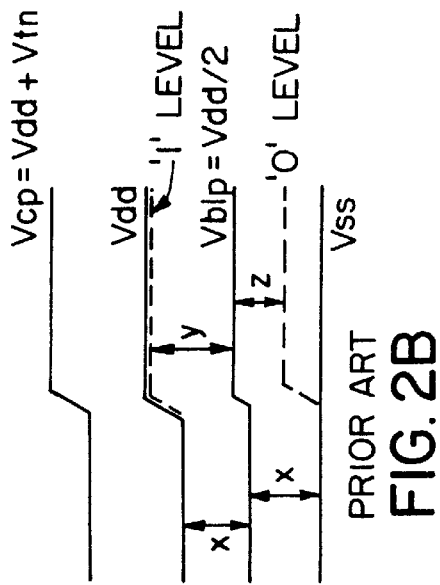

The effect of this structure is to synthesize the equivalent of Vdd/2 biasing of the capacitor 3, and a reduction in sensitivity to the voltage bump. The voltage margins "x" for a "0" and a "1", before and after the voltage "bump", are thereby maintained, as shown in FIG. 1B, eliminating the noise problem incurred in the prior art cell of FIG. 2A.

In addition, the cell represents a decoupling capacitance of C/4, where C=the total capacitance of the two capacitors 3 and 7. Thus in a 1 Mbit memory which uses 30 pF cells, it is estimated that about 8 nF would be created between power rails with no extra integrated circuit chip area required, which both improves noise sensitivity and reduces noise generation in the memory.

It should be noted that while it is preferred that capacitor 7 should have capacitance which is similar to capacitor 3, it could have a different capacitance, and at least some of the benefit described above would be achieved.

Figure 4:
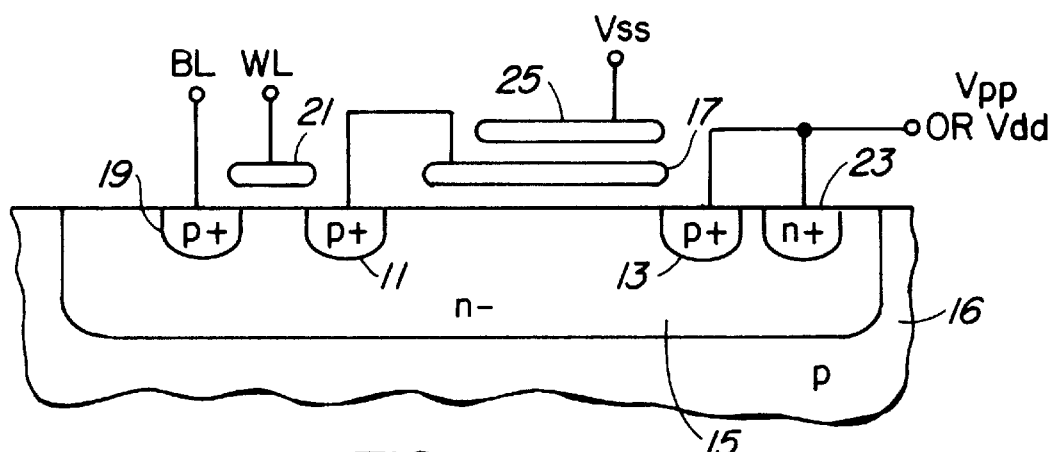

FIG. 4 illustrates an embodiment of the invention in an integrated circuit which uses p-channel FETs. A pair of p+ diffused or implanted regions 11 and 13 in an n-well 15 in a P type substrate 16 form the source and drain of a p-channel FET. A polysilicon (conductive) layer 17 which is insulated from the upper surface of the n type well 15 above a p-channel between the source and drain forms a gate to the FET. The region 17 is connected to the source or drain region 11. The result is an FET which forms a capacitor.

A second FET is formed of a third p+ diffused or implanted region 19 into n-well 15, separated from region 11 by a channel region adjacent the surface of the substrate. A polysilicon layer 21 insulated from the surface of the n-well 15 above the channel region forms a gate.

An n+ diffused or implanted region 23 in the n-well, separated from p+ region 13, forms a connection to the n-type well 15.

The FET formed of p+ diffused or implanted regions 19 and 11 and gate 21 forms the access FET 1, the gate being connected to the word line WL and the source or drain 19 being connected to the bit line BL.

In accordance with this embodiment of the invention, a further polysilicon layer 25 is insulated from (e.g. by a layer of silicon dioxide), but is located above gate 17, and is preferably the same or approximately the same size as gate 17. Polysilicon layer 25 is typically a Poly 2 layer used for interconnect and is connected to Vss which is substantially of opposite polarity to Vdd or Vpp.

The gate 17 forms a capacitor with layer 25, forming capacitor 7. Gate 17 also forms a capacitor 3, with the substrate. Thus gate 17 constitutes a common plate of capacitor 7 and capacitor 3, and is connected to pass FET 1 via the diffused or implanted region 11.

The bottom plate of capacitor 3, and the substrate, are connected via p+ region 13 and n+ region 23 to Vdd or Vpp, and the conductive polysilicon layer 25 is connected to Vss, as shown in FIG. 3.

Figure 5:
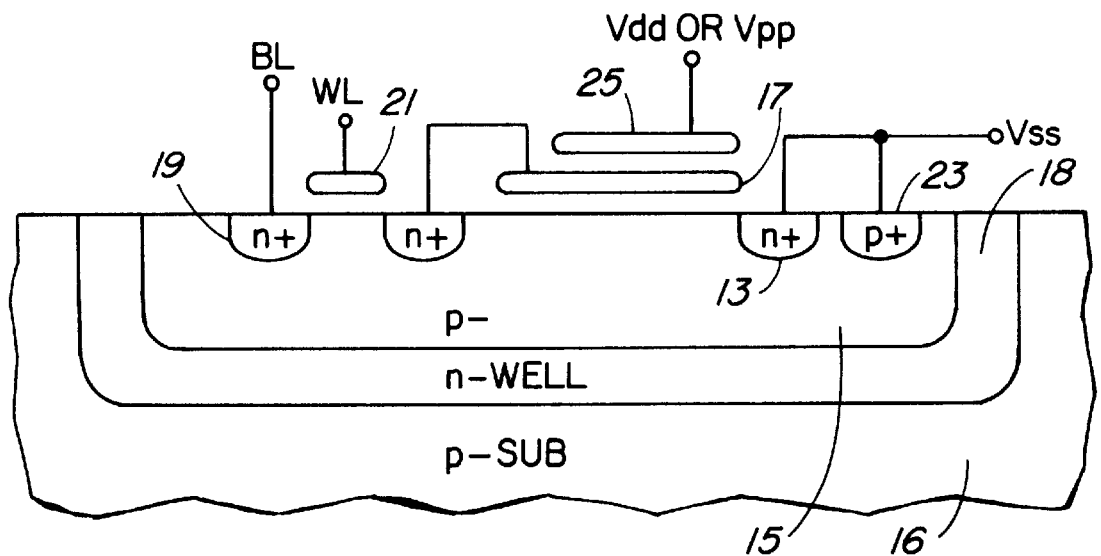

It should be noted that in FIGS. 3 and 4, the pass FET 1 and the FET capacitor 3 are shown as p-channel FETs, and the precharge enable FET 5 is an n-channel FET. However the invention can be made in which FET 1 and FET capacitor 3 are n-channel and FET 5 is p-channel, and the voltages shown would be of opposite polarity (Vss substituted for Vdd and Vdd substituted for Vss, and (Vss–Vtp) substituted for Vpp). Such a structure is shown in FIG. 5, with corresponding reference numerals to FIG. 4. However in this case the p-type region which corresponds to n-type region 15 in FIG. 4 is shown contained in an n-well 18 diffused or implanted in a p-type substrate 16, if a p-type substrate is used.

A person understanding this invention may now conceive of alternative structures and embodiments or variations of the above. All those which fall within the scope of the claims appended hereto are considered to be part of the present invention.

I claim:

1. A DRAM bit storage cell comprising a pair of capacitors each having one plate connected to a source or drain of a pass FET, another plate of a first of the pair of capacitors of similar type connected to a first fixed voltage rail or a fixed voltage rail larger in magnitude than the first voltage rail, and another plate of a second of the pair of capacitors connected to a second fixed voltage rail opposite in polarity to the first voltage rail.

2. A DRAM cell as defined in claim 1 in which the one plate of both capacitors of the pair of capacitors being common.

3. A DRAM bit storage cell comprising a pair of capacitors each having one plate connected to a source or drain of a pass FET, another plate of a first of the pair of capacitors connected to a first voltage rail or a fixed voltage rail larger in magnitude than the voltage of the first voltage rail, and another plate of a second of the pair of capacitors connected to a second fixed voltage rail opposite in polarity to the first voltage rail, the one plate of both capacitors of the pair of capacitors being common, the common plate comprising an insulated gate electrode of an FET capacitor.

4. A DRAM cell as defined in claim 3 in which the gate electrode is formed of a first layer of polysilicon, and in which the another plate of the second of the pair of capacitors is formed of a second layer of polysilicon insulated from, and overlying, the first layer of polysilicon.

5. A DRAM bit storage circuit comprising a bit line for selectively receiving a bit line precharge voltage and a word line for selectively receiving a first voltage from a first voltage source, a cell access FET having a gate connected to the word line, a source or drain connected to the bit line, and another of the source or drain connected to a first plate of a first capacitor, a second plate of the first capacitor connected to a second fixed voltage source having similar polarity as the first voltage source, and a second capacitor of similar type as the first capacitor connected between the first plate of the first capacitor and a third fixed voltage source having polarity opposite to the first voltage source.

6. A DRAM bit storage circuit comprising a bit line for selectively receiving a bit line precharge voltage and a word line for selectively receiving a first voltage from a first voltage source, a cell access FET having a gate connected to the word line, a source or drain connected to the bit line, and another of the source or drain connected to a first plate of a first capacitor, a second plate of the first capacitor connected to a second voltage source having similar polarity as the first voltage source, and a second capacitor connected between the first plate of the first capacitor and a third voltage source having polarity opposite to the first voltage source the second capacitor having approximately similar capacitance as the first capacitor.

7. A DRAM circuit as defined in claim 6 in which a plate of the second capacitor other than the plate connected to the third voltage source is a common plate with the first plate of the first capacitor.

8. A DRAM circuit as defined in claim 7 in which the common plate of the first and second capacitors are comprised of a polysilicon gate of an FET which gate is short circuited to a source or drain of the FET, and in which another plate of the second capacitor is comprised of a polysilicon layer spaced and insulated from the polysilicon gate.

9. A DRAM circuit as defined in claim 7 in which the FET is p-channel type, the first voltage source has voltage Vdd, the voltage applied to the another plate of the first capacitor is Vdd or voltage Vpp which is boosted from Vdd by Vtn, and the third voltage source has voltage Vss, where Vtn is the operation threshold voltage of an n-channel FET.

10. A DRAM circuit as defined in claim 7 in which the FET is n-channel type, the first voltage source has voltage Vss, the voltage applied to the another plate of the first capacitor is Vss or a voltage which is Vss–Vtp, and the third voltage source has voltage Vdd, where voltage Vtp is the operation threshold voltage of a p-channel FET.

11. A DRAM circuit as defined in claim 7, in which the second capacitor is overlaid onto or stacked on top of the first capacitor.

12. A DRAM bit storage cell comprising a pair of serially connected capacitors forming a capacitor voltage divider, having a junction connected to a source or drain of a pass FET, a charge storage capacitor of the pair of capacitors having a plate connected to a first voltage rail or to a source of voltage boosted from the voltage of the first voltage rail, and a plate of the other of the pair of capacitors connected to a voltage rail having a voltage of a value such as to cause the voltage at said junction to be approximately half the voltage of the first voltage rail or half the boosted voltage.

13. A DRAM cell as defined in claim 12 in which plates of the capacitors which are connected at the junction are common.

14. An integrated circuit memory comprising, for each of plural charge storage cells, a first p-channel FET comprising a spaced pair of p+ type regions diffused or implanted into an n- type well of a p-type substrate and a first polysilicon gate overlying and insulated from a channel region adjacent to a surface of the n-type well between the spaced pair of p+ type regions, a polysilicon plate overlying and insulated from the polysilicon gate, a second p-channel FET having a third p+ type region diffused or implanted into the n-type well, a second polysilicon gate overlying and insulated from a channel region adjacent to a surface of the n-type well between the third p+ type region and one of the pair of p+ type regions, the first polysilicon gate being connected to the one of the pair of p+ type regions, the polysilicon plate being connected to a voltage source Vss, the second polysilicon gate being connected to a word line, the third p+ type region being connected to a bit line, and another of the pair of p+ type regions being connected to a source of Vdd or Vpp voltage.

15. An integrated circuit memory comprising, for each of plural charge storage cells, a first n-channel FET comprising a spaced pair of n+ type regions diffused into an p- type well contained in an n-type well in a p-type substrate substrate and a first polysilicon gate overlying and insulated from a channel region adjacent to a surface of the substrate between the spaced pair of n+ type regions, a polysilicon plate overlying and insulated from the polysilicon gate, a second n-channel FET having a third n+ type region diffused into the p-type well, a second polysilicon gate overlying and insulated from a channel region adjacent a surface of the substrate between the third n+ type region and one of the pair of n+ type regions, the first polysilicon gate being connected to the one of the pair of n+ type regions, the polysilicon plate being connected to a voltage source Vdd or Vpp, the second polysilicon gate being connected to a word line, the third n+ type region being connected to a bit line, and another of the pair of n+ type regions being connected to a voltage source of Vss.

* * * * *